(12) United States Patent
Hu

(10) Patent No.: US 6,524,951 B2
(45) Date of Patent: *Feb. 25, 2003

(54) METHOD OF FORMING A SILICIDE INTERCONNECT OVER A SILICON COMPRISING SUBSTRATE AND METHOD OF FORMING A STACK OF REFRACTORY METAL NITRIDE OVER REFRACTORY METAL SILICIDE OVER SILICON

(75) Inventor: Yongjun Jeff Hu, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,216

(22) Filed: Mar. 1, 1999

(65) Prior Publication Data

US 2001/0014532 A1 Aug. 16, 2001

(51) Int. Cl.[7] .......................................... H01L 21/4763
(52) U.S. Cl. .................... 438/649; 438/592; 438/594; 438/618; 438/637; 438/647; 438/657
(58) Field of Search ..................... 438/649, 592, 438/595, 618, 637, 647, 655, 657, 683, 755

(56) References Cited

U.S. PATENT DOCUMENTS

| 4,746,219 A | 5/1988 | Holloway et al. |
| 4,863,559 A | 9/1989 | Douglas ..................... 156/643 |

(List continued on next page.)

FOREIGN PATENT DOCUMENTS

| EP | 0 631 309 A2 | 12/1994 |
| EP | 0 631 309 A3 | 12/1994 |
| JP | 06-010673 A | 1/1994 |

OTHER PUBLICATIONS

U.S. application No. 09/134,624, Hu, filed Aug. 1998.
U.S. application No. 09/026,104, Hu, filed Feb. 1998.
Byun, Jeong Soo et al., "Formation Of A Large Grain Sized TiN Layer Using $TiN_x$, The Epitaxial Continuity At The Al/TiN Interface . . . ", *J. Appl. Phys.*, 78(3), pp. 1719–1724 (Aug. 1995).

(List continued on next page.)

Primary Examiner—David Nelms
Assistant Examiner—Reneé R. Berry
(74) Attorney, Agent, or Firm—Wells St. John P.S.

(57) ABSTRACT

The invention encompasses methods of forming silicide interconnects over silicon comprising substrates. In one implementation, a first layer comprising a metal and a non-metal impurity is formed over a region of a silicon comprising substrate where a silicide interconnection is desired. An elemental metal comprising second layer is formed over the first layer. The substrate is annealed to cause a reaction between at least the elemental metal of the second layer and silicon of the substrate region to form a silicide of the elemental metal of the second layer. In another considered aspect, a method of forming a silicide interconnect over a silicon comprising substrate includes providing a buffering layer to silicon diffusion between a refractory metal comprising layer and a silicon containing region of a substrate. The substrate is annealed under conditions effective to diffuse at least some of at least one of the refractory metal and the silicon through the buffering layer to form a silicide of the refractory metal, with the buffering layer during the annealing reducing silicon consumption from the region over that which would otherwise occur under the same annealing conditions were the buffering layer not present. The invention also encompasses a method of forming a stack of refractory metal nitride over refractory metal silicide over silicon includes providing a silicon comprising substrate.

46 Claims, 2 Drawing Sheets

U.S. PATENT DOCUMENTS

| | | | |
|---|---|---|---|
| 4,994,402 A | 2/1991 | Chiu | 437/41 |
| 5,032,233 A | 7/1991 | Yu et al. | 204/192.48 |
| 5,043,300 A | 8/1991 | Nulman | 437/200 |
| 5,084,406 A | 1/1992 | Rhodes et al. | 437/52 |
| 5,094,977 A | 3/1992 | Yu et al. | 437/174 |
| 5,147,819 A | 9/1992 | Yu et al. | 437/173 |
| 5,187,122 A | 2/1993 | Bonis | 437/200 |
| 5,196,360 A | 3/1993 | Doan et al. | 437/41 |
| 5,236,865 A | 8/1993 | Sandhu et al. | 437/174 |
| 5,278,098 A | 1/1994 | Wei et al. | 437/192 |
| 5,296,404 A | 3/1994 | Akabori et al. | 437/173 |
| 5,326,404 A | 7/1994 | Sato | 118/723 |
| 5,341,016 A | 8/1994 | Prall et al. | 257/412 |
| 5,378,641 A | 1/1995 | Cheffings | 437/35 |
| 5,391,520 A | 2/1995 | Chen et al. | 437/200 |
| 5,480,814 A | 1/1996 | Wuu et al. | 437/41 |
| 5,481,129 A | 1/1996 | DeJong et al. | 257/360 |
| 5,589,417 A | 12/1996 | Jeng | 437/190 |
| 5,593,511 A | 1/1997 | Foster et al. | 148/238 |
| 5,627,102 A | 5/1997 | Shinriki et al. | 437/192 |
| 5,654,235 A | 8/1997 | Matsumoto et al. | 438/643 |
| 5,683,930 A | 11/1997 | Batra et al. | 437/60 |
| 5,756,394 A | 5/1998 | Manning | 438/618 |
| 5,766,997 A | 6/1998 | Takeuchi | 438/257 |
| 5,776,831 A | 7/1998 | Padmanabhan et al. | 438/653 |
| 5,783,478 A | 7/1998 | Chau et al. | 438/592 |
| 5,925,225 A | 7/1999 | Ngan et al. | 204/192.17 |
| 5,985,759 A | 11/1999 | Kim et al. | 438/653 |
| 6,074,921 A * | 6/2000 | Lin | 438/299 |
| 6,080,665 A | 6/2000 | Chen et al. | 438/653 |
| 6,117,761 A * | 9/2000 | Manning | 438/618 |
| 6,156,647 A | 12/2000 | Hogan | 438/653 |

OTHER PUBLICATIONS

Byun, Jeong Soo, "Epitaxial C49–TiSi$_2$ Formation On (100)Si Substrate Using TiN$_x$, And Its Electrical Charateristics As A Shallow Contact Metallization", *J.Electrochem. Soc.*, vol. 143, No. 6, pp. 1984–1991 (Jun. 1996).

Byun, Jeong Soo et al., "Epitaxial TiSi$_2$ Growth On Si(100) From Reactive Sputtered TiN$_2$ And Subsequent Annealing", *Materials Research Soc. Proceedings*, Pittsburgh, vol. 355, pp. 465–470 (1995).

Stanley Wolf, Ph.D., *Silicon Processing for the VLSI Era*, vol. II, pp. 567–583 (1990 Lattice Press).

Byun, Jeong Soo, et al., "TiN/TiSi$_2$ Formation Using TiN$_x$ Layer And Its Feasibilities In ULSI", *Jpn. J. Appl. Phys.*, vol. 35, pp. 982–986 (1995).

Murakami, Shigeru, et al., "Plasma–Nitidated Ti Contact System For VLSI Interconnections", *I.E.E.E., Multilevel VLSI Interconnection Conference*, IEEE Catalog No. 87CH2488–5, pp. 148–154, (Jun. 1987).

Byun, Jeong Soo, et al., "W As A Bit Line Interconnection In Capacitor–Over–Bit–Line (COB) Structured Dynamic Random Access Memory (DRAM) and Feasible Diffusion Barrier Layer", *J. Appl. Phys.*, vol. 35, pp. 1086–1089 (1996).

* cited by examiner

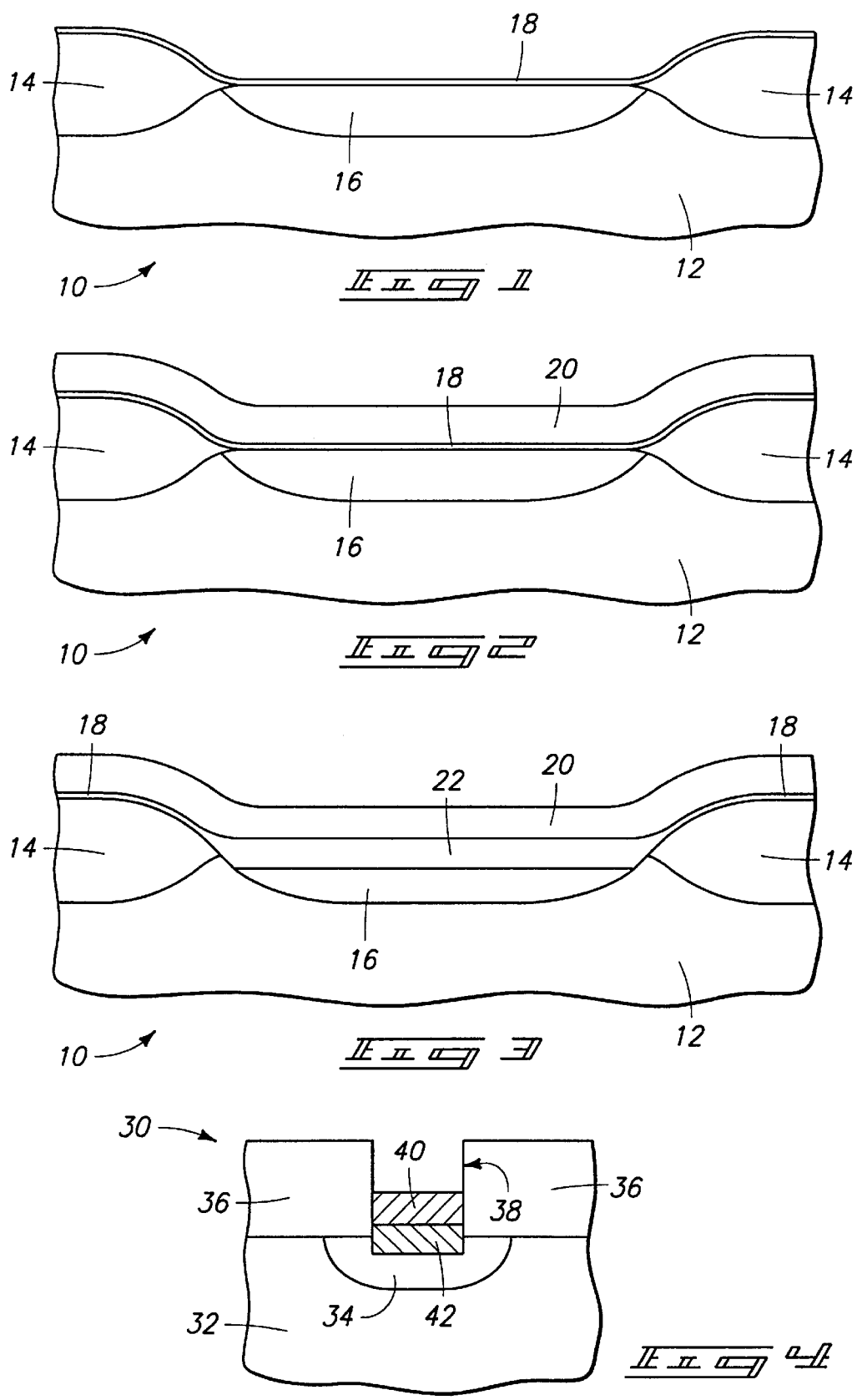

METHOD OF FORMING A SILICIDE INTERCONNECT OVER A SILICON COMPRISING SUBSTRATE AND METHOD OF FORMING A STACK OF REFRACTORY METAL NITRIDE OVER REFRACTORY METAL SILICIDE OVER SILICON

TECHNICAL FIELD

This invention relates to methods of forming silicide interconnects over silicon comprising substrates, and to methods of forming stacks of refractory metal nitrides over refractory metal suicides over silicon.

BACKGROUND OF THE INVENTION

In the processing of integrated circuits, electrical contact is typically made to isolated active device regions formed within a wafer substrate typically comprising monocrystalline silicon. The active regions are typically connected by electrically conductive paths or lines which are fabricated above an insulative material formed over the substrate surface. Further, electrical contact is also typically made to other conductive regions received outwardly of the wafer, such as to conductive lines, contact plugs and other devices. To provide electrical connection between two conductive regions, an opening in an insulative layer is typically etched to the desired regions to enable subsequently formed conductive films to make electrical connection with such regions.

The drive for integrated circuits of greater complexity, performance and reduced size has driven designers to shrink the size of devices in the horizontal plane. Yet to avoid excessive current density, the horizontal scaling has not necessarily been accompanied by a reduction in the vertical dimension. This has resulted in an increase of the ratio of device height to device width, something generally referred to as aspect ratio, and particularly with respect to contact openings. Such currently ranges from 1.0 to 5, and is expected to increase. The circuit density increase places increasing constraints on the conductivity of the contacts themselves.

As transistor active area and other device dimensions approached 1 micron, conventional process parameters resulted in intolerable increased resistance between the active region or device area and the conductive layer. A principal way of reducing such contact resistance is by formation of a metal silicide atop the active area prior to application of the conductive film for formation of the conductive runner. Common metal suicides are refractory metal silicides, such as $TiSi_x$, where "x" is predominately 2. The $TiSi_x$ material is typically provided by first applying a thin layer of titanium atop the wafer which contacts the silicon containing active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts silicon. The applied titanium film typically everywhere else overlies an insulative, and substantially non-reactive, $SiO_2$ layer. After the first annealing, unreacted titanium may be removed selectively relative to the formed silicide by a wet etch. Further, a post-silicidation anneal might be conducted to lower sheet resistance of the formed silicide.

In the silicidation process, silicon from contact regions of the substrate diffuses upward into the refractory metal layer. Similarly, the refractory metal diffuses into the underlying silicon. The intent is for the titanium and silicon to react with each other to form a silicide thick enough to provide low sheet resistance and make a highly conductive contact interface. As a result, the doped active area of the silicon substrate (or other silicon construction) becomes thinner due to the consumption of silicon during the reaction. The resultant silicide is said to intrude or sink into the substrate or device. Over-consumption of the underlying silicon can be problematic for any silicon circuit element, tending to cause voids and thus device failures. Tendency in the industry is to make shallower and shallower active area junctions in the silicon substrates. In some instances, silicide contacts of sufficient thickness cannot be formed without completely destroying a junction because of silicon consumption from the underlying substrate.

The invention was principally motivated in addressing these problems, but is not so limited and has other applicabilities as will be appreciated by the artisan.

SUMMARY

The invention encompasses methods of forming silicide interconnects over silicon comprising substrates. In one implementation, a first layer comprising a metal and a non-metal impurity is formed over a region of a silicon comprising substrate where a silicide interconnection is desired. An elemental metal comprising second layer is formed over the first layer. The substrate is annealed to cause a reaction between at least the elemental metal of the second layer and silicon of the substrate region to form a silicide of the elemental metal of the second layer.

In another considered aspect, a method of forming a silicide interconnect over a silicon comprising substrate includes providing a buffering layer to silicon diffusion between a refractory metal comprising layer and a silicon containing region of a substrate. The substrate is annealed under conditions effective to diffuse at least some of at least one of the refractory metal and the silicon through the buffering layer to form a silicide of the refractory metal, with the buffering layer during the annealing reducing silicon consumption from the region over that which would otherwise occur under the same annealing conditions were the buffering layer not present.

In another considered aspect, a method of forming a stack of refractory metal nitride over refractory metal silicide over silicon includes providing a silicon comprising substrate. A first layer comprising $MN_x$ is formed over the silicon comprising substrate, where M is a refractory metal and "x" is greater than 0 and less than 1. A second layer predominately comprising elemental M is formed over the first layer. The substrate is annealed in a nitrogen containing atmosphere to cause a reaction of at least M of the first layer with silicon of the substrate to form a silicide of M in contact with underlying silicon material of the substrate and react M of the second layer to transform a least an outermost portion of the second layer to predominately comprise a stoichiometric nitride of M.

BRIEF DESCRIPTION OF THE DRAWINGS

Preferred embodiments of the invention are described below with reference to following accompanying drawings.

FIG. 1 is a diagrammatic sectional view of an exemplary semiconductor wafer fragment at one processing step in accordance with an aspect of the invention.

FIG. 2 is a view of the FIG. 1 wafer fragment at a processing step subsequent to that shown by FIG. 1.

FIG. 3 is a view of the FIG. 1 wafer fragment at a processing step subsequent to that shown by FIG. 2.

FIG. 4 is a diagrammatic sectional view of an alternate exemplary semiconductor wafer fragment processed in accordance with an aspect of the invention.

DETAILED DESCRIPTION OF THE PREFERRED EMBODIMENTS

Figure 5:
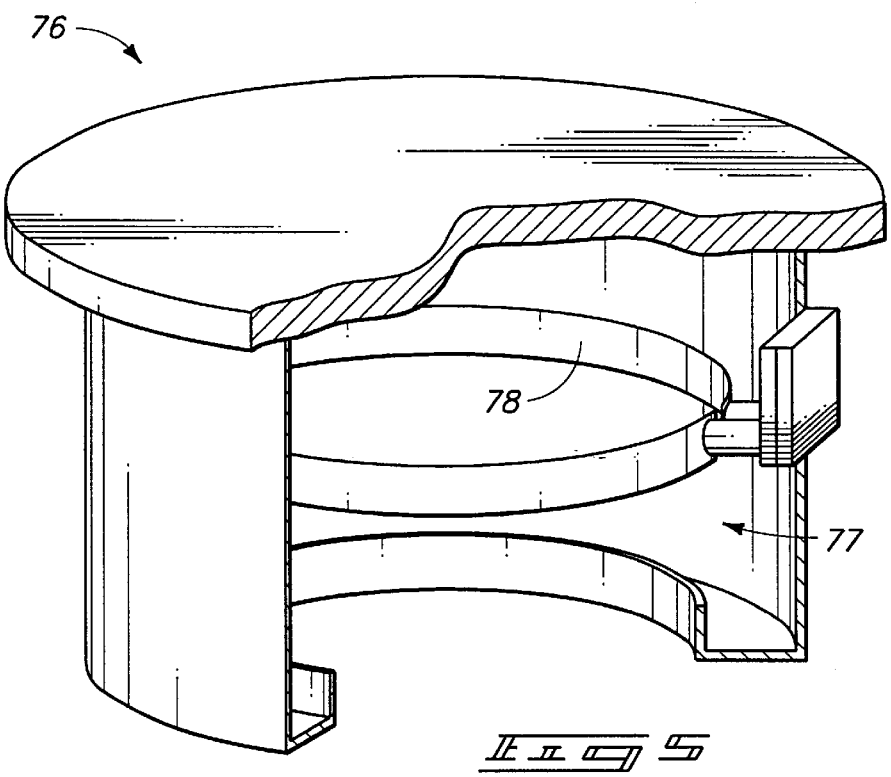
FIG. 5 is a perspective view of a processing reactor, with a portion broken away for clarity, in accordance with one preferred embodiment of the present invention.

This disclosure of the invention is submitted in furtherance of the constitutional purposes of the U.S. Patent Laws "to promote the progress of science and useful arts" (Article 1, Section 8).

A first preferred embodiment of a method of forming a silicide interconnect over a silicon comprising substrate (i.e., monocrystalline or polycrystalline) is described with reference to FIGS. 1–3. FIG. 1 illustrates a semiconductor wafer fragment 10 comprised of a bulk monocrystalline silicon substrate material 12. In the context of this document, the term "semiconductor substrate or semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation oxide regions 14 have been formed relative to substrate 12. An exemplary highly doped diffusion region 16 is provided therebetween. A first layer 18 comprising a metal and a non-metal impurity is provided over region 16 of silicon comprising substrate 12 where a silicide interconnection is desired to be made. Example preferred metals for layer 18 are refractory metals. Example non-metal impurities include nitrogen, phosphorus, and arsenic, with nitrogen being most preferred. More preferably, the first layer preferably comprises, and even more preferably consists essentially of, $MN_x$ where "M" is an elemental metal (preferably refractory, such as Ti) and "x" is greater than 0 and less than 1. Preferred ranges for "x" are from 0.2 to 0.8, with the range of from 0.5 to 0.6 being even more preferred. One preferred way of forming the preferred $MN_x$ layer is as described in our co-pending application U.S. patent application Ser. No. 09/026,104, filed on Feb. 19, 1998, and entitled "Asymmetric, Double-Sided Self-Aligned Silicide And Method Of Forming The Same" having the same inventive entity as this patent. An even more preferred method for forming such layer is as described in our co-pending application entitled "Method Of Depositing A Nitrogen Enriched Metal Layer, Method Of Forming A Silicide Contact To A Silicon Comprising Substrate, Method Of Forming A Metal Source Layer In An Integrated Circuit, Method Of Analyzing Impact Of Operating Parameter Changes For A Plasma Deposition Reactor Having An Inductive Coil Positioned Therein, Method Of Forming Integrated Circuitry", also having the same inventive entity as this patent and filed on the same day as the application from which this patent matured. Both of these applications are hereby incorporated fully herein by reference.

Figure 6:
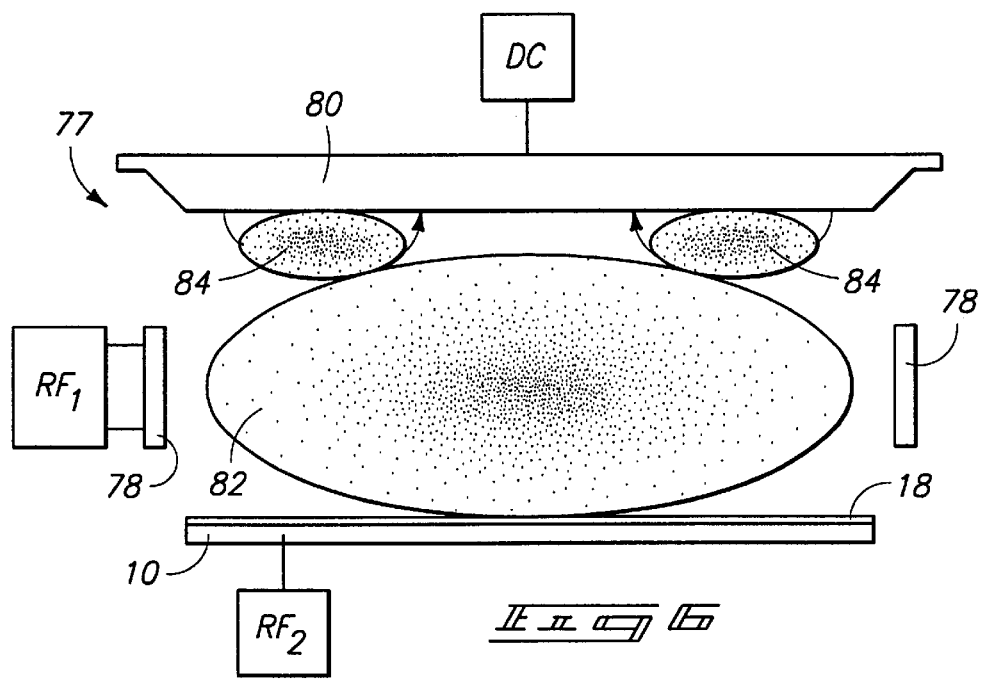
FIG. 6 is an elevational schematic view of one aspect of processing in accordance with a preferred embodiment of the invention.

With respect to the more preferred method of forming an $MN_x$ layer, reference is made to FIGS. 5 and 6. FIG. 5 depicts a broken perspective view of an exemplary processing reactor emphasizing preferred inductive coil positioning, with other reactor components not being depicted for clarity. FIG. 6 diagrammatically depicts operation of the exemplary reactor showing target, wafer, inductive coil, and plasma generation as will now be more specifically described. A sputtering reactor 76 in FIG. 5 includes an inductive coil 78 mounted within a reactor chamber 77. The preferred and reduction-to-practice sputter deposition system is a Magnatron System available from Applied Materials as an Ion Metal Plasma (IMP) Reactor™. Such is capable of retaining and DC biasing a target 80 and an $RF_2$ biased substrate (FIG. 6), such as for example substrate 10 as depicted in FIG. 1.

In preferred aspects of the invention, a nitrogen containing source gas and a sputtering gas are fed to reactor chamber 77. The reactor is operated during such feeding to provide a selected target power, inductive coil power, and substrate bias to deposit an $MN_x$ comprising layer 18 onto substrate 10. Using the reduction-to-practice IMP reactor, exemplary operable ranges include a substrate bias ($RF_2$) from 0W (neutral) to 1,000 W, an inductive coil power ($RF_1$) from 1.0 to 5.0 kW, and a target power (DC) of from 1.5 to 5.0 kW. The preferred nitrogen containing source gas is $N_2$, with the preferred sputtering gas being a noble gas, such as Ar.

Preferred reactor temperature and pressure ranges for the processing as depicted in FIG. 6 are from room temperature to 250° C. for backside temperature, and preferably from about 10 mTorr to about 30 mTorr. Preferred $RF_2$ bias is from 300 to 500 Watts. Still referring to FIG. 6, a largely magnatron plasma 84 forms near target 80 for sputtering material therefrom, with inductive coil 78 resulting in formation of a gas plasma 82 therebeneath. A high electric field or self-bias develops in the boundary layer or sheath between the plasma and the substrate which accelerates the metal ions toward the substrate in a vector generally perpendicular to the wafer surface, particularly for increasing $RF_2$ bias values. In the preferred example, gas plasma 82/84 as generated within reactor chamber 77 extends entirely between at least a portion of target 80 and a portion of substrate 10, resulting in deposition of layer 30 as diagrammatically shown in FIG. 6.

A preferred thickness range for layer 18 is from 30 Angstroms to 300 Angstroms. A preferred goal with respect to but one implementation of the invention is to achieve silicon consumption from region 16 at less than or equal to about 300 Angstroms. Reduction-to-practice examples, described below, utilized layer 18 thicknesses of 75 and 150 Angstroms.

Referred to FIG. 2, an elemental metal comprising second layer 20 is formed over first layer 18. Preferred elemental metals for layer 20 are refractory metals, with layer 20 most preferably consisting essentially of an elemental refractory metal. Further more preferably, the elemental metal of layer 20 is the same as the predominate metal of layer 18. Alternately but less preferred, the elemental metal of layer 20 and that of layer 18 can be different metals. Layer 20 is also preferably formed to be thicker than layer 18, with an example preferred thickness range for layer 20 being from 30 Angstroms to 3,000 Angstroms. A specific preferred example for layer 20 is sputter or chemical vapor deposited elemental titanium substantially void of any impurity.

Alternately but less preferred, layer 20 can comprise a non-metal impurity the same as or different from the non-metal impurity of layer 18. Where such metal impurity in layer 20 is present, the metal purity of second layer 20 is most preferably greater than the respective metal purity of first layer 18. Most preferably where a non-metal impurity exists in layer 20, it is present at less than or equal to 30% atomic, regardless. Accordingly, a specific yet lesser preferred example for layer 20 is an $MN_x$ material where "x" is less than or equal to 0.3. However, most preferred as referred to above is where layer 20 consists essentially of an elemental refractory metal, such as Ti.

Referring to FIG. 3, substrate 10 is annealed to cause a reaction between, in one embodiment, at least the elemental metal of second layer 20 and silicon of substrate region 16 to form a silicide region 22 of the elemental metal of second layer 20. In another considered implementation, the annealing is conducted to cause a reaction between at least the metal of first layer 18 and silicon of the substrate region to form silicide region 22 of the metal of first layer 18. Most preferably, elemental metal from both of layers 20 and 18 during the annealing combines with silicon of substrate region 16 to form silicide. Accordingly in the most preferred example, titanium silicide is a preferred material for layer 22. As shown, and preferably, the annealing reacts less than all of the metal of layer 20 over substrate region 14 into silicide material.

Further preferably, such annealing is conducted in a nitrogen containing ambient (i.e., $N_2$, $NH_3$ or others) which transforms at least an outermost portion of second layer 20 to predominately (more than 50%) comprise a stoichiometric nitride of the metal of layer 20, for example stoichiometric titanium nitride. Such preferred processing, and in part dependent upon the composition and material of layer 20, might also be effective to transform the entire volume thereof which is not transformed to silicide into a stoichiometric metal nitride. FIG. 3 therefor depicts an example region over diffusion region 16 which comprises a refractory metal nitride (not specifically designated with a numeral) over a refractory metal silicide 22 (with perhaps elemental metal or other material of layer 20 intermediate thereof) over silicon of exemplary region 16.

Accordingly in one implementation, the invention comprises a method of forming a stack of refractory metal nitride over refractory metal silicide over silicon. Such method includes providing a silicon comprising substrate, such as diffusion region 16. A first layer comprising $MN_x$ is formed over silicon comprising substrate 16, where "M" is a refractory metal, and "x" is greater than 0 and less than 1. Layer 18 is but one example. A second layer predominately (greater than 50%) comprising elemental "M" is formed over the first layer, with the illustrated layer 20 being one example. The substrate is then annealed in a nitrogen containing atmosphere to cause a reaction of at least "M" of the first layer, with silicon of the substrate to form a silicide of "M" in contact with underlying silicon material of the substrate and to react "M" of the second layer to transform at least an outermost portion thereof to predominately (greater than 50%) comprise a stoichiometric nitride of "M".

In another considered implementation of the invention, layer 18 constitutes but one example of a buffering layer to silicon diffusion between a refractory metal comprising layer and a silicon containing region of a substrate. The substrate is annealed under conditions effective to diffuse at least some of at least one of the refractory metal and the silicon through the buffering layer to form a silicide of the refractory metal. In the preferred embodiment, the buffering layer reduces silicon consumption during the annealing from the region over that which would otherwise occur under the same annealing conditions were the buffering layer not present. For ultra-shallow silicide junction formation and beyond, and where for example diffusion region 16 has a junction depth of 1,000 Angstroms, the buffering layer is chosen and the annealing is conducted to achieve no more than 300 Angstroms of consumption of silicon thickness from silicon containing region 16, and preferably even less silicon consumption.

The preferred buffering layer as described is not predominately comprised of a stoichiometric compound, with the above $MN_x$ being but one preferred example. Alternate example materials for layer 18 and by way of example only, including stoichiometric metal compounds, are TaSi, MoSi, and TiGe. A specific preferred example for the above-described annealings includes RTP annealing at for example 610° C. for 40 seconds in a $N_2$ ambient, followed by further annealing at 710° C. for 10 seconds in a $N_2$ ambient. Reduction-to-practice examples included annealing of a stack of 250 Angstroms of titanium over 150 Angstroms of $TiN_x$ (where "x" was about 0.5) over monocrystalline silicon, and a stack of 250 Angstroms of elemental titanium over 75 Angstroms of the same $TiN_x$ over monocrystalline silicon. The first of such examples formed a $TiSi_x$ film in crystalline form of 300 Angstroms thickness, while the second formed the same film of 230 Angstroms thickness. Accordingly, desirable thin and smooth layers of silicide can be formed which facilitate reduction in undesired junction diode leakage.

FIGS. 1–3 illustrate but one example process and construction utilizing methods in accordance with the invention. Any other construction of the method is also, of course, contemplated, with FIG. 4 illustrating but one example. There shown is a construction comprised of a silicon comprising substrate 32 having a diffusion region 34 formed therein. An insulative material 36 is formed over substrate 32 and has been patterned to include a contact opening 38 to diffusion region 34. A preferred stack of a stoichiometric titanium nitride layer 40 is shown received over an exemplary titanium silicide region 42 at the base of the contact opening and extending into diffusion region 34, and which is preferably processed as described by the example above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a silicide interconnect over a silicon comprising substrate comprising:

forming a first layer comprising a metal and a non-metal impurity over a region of the silicon comprising substrate where a silicide interconnection is desired;

forming an elemental metal comprising second layer over the first layer; and annealing the substrate to cause a reaction between at least the elemental metal of the second layer and silicon of the substrate region to form a silicide of the elemental metal of the second layer.

2. The method of claim 1 wherein the first layer is no greater than 300 Angstroms thick.

3. The method of claim 1 wherein the first layer is no greater than 150 Angstroms thick.

4. The method of claim 1 wherein the first layer is from 30 Angstroms to 300 Angstroms thick.

5. The method of claim 1 wherein the second layer is thicker than the first layer.

6. The method of claim 1 wherein the non-metal impurity comprises nitrogen.

7. The method of claim 1 wherein the metal of the first layer and the elemental metal of the second layer are the same metal.

8. The method of claim 1 wherein the metal of the first layer and the elemental metal of the second layer are different metals.

9. The method of claim 1 wherein the annealing reacts less than all of the metal of the second layer into the silicide.

10. The method of claim 1 wherein the second layer consists essentially of the elemental metal.

11. The method of claim 1 wherein the second layer comprises a non-metal impurity.

12. The method of claim 11 wherein metal purity in the second layer is greater than in the first layer.

13. The method of claim 11 wherein the non-metal impurity in the first layer is the same as the non-metal impurity in the second layer.

14. The method of claim 11 wherein the non-metal impurity in the second layer is present at less than or equal to 30% atomic.

15. A method of forming a silicide interconnect over a silicon comprising substrate comprising:

forming a first layer comprising a metal and a non-metal impurity over a region of the silicon comprising substrate where a silicide interconnection is desired;

forming an elemental metal comprising second layer over the first layer; and annealing the substrate to cause a reaction between at least the metal of the first layer and silicon of the substrate region to form a silicide of the metal of the first layer.

16. The method of claim 15 wherein the annealing causes a reaction between the elemental metal of the second layer and silicon of the substrate region to form a silicide of the elemental metal of the second layer.

17. The method of claim 16 wherein the metal of the first layer and the elemental metal of the second layer are the same metal.

18. A method of forming a silicide interconnect over a silicon comprising substrate comprising:

forming a first layer comprising $MN_x$ over a region of the silicon comprising substrate where a silicide interconnection is desired, where "M" is an elemental metal and "x" is greater than 0 and less than 1;

forming an elemental metal comprising second layer over the first layer; and annealing the substrate to cause a reaction between at least the elemental metal of the second layer and silicon of the substrate region to form a silicide of the elemental metal of the second layer.

19. The method of claim 18 wherein the forming of the first layer comprises:

providing a sputter deposition reactor chamber having an inductive coil positioned therein, a metallic target comprising M position therein, and the substrate positioned therein;

feeding a nitrogen containing source gas and a sputtering gas to the reactor chamber; and operating the reactor to provide a selected target power, inductive coil power and substrate bias during the feeding effective to deposit the $MN_x$ comprising layer.

20. The method of claim 19 wherein the substrate bias during the operating is neutral.

21. The method of claim 18 wherein M and the elemental metal of the second layer are the same metal.

22. The method of claim 18 wherein M and the elemental metal of the second layer are different metals.

23. The method of claim 18 wherein "x" is from 0.2 to 0.8.

24. The method of claim 18 wherein "x" is from 0.5 to 0.6.

25. The method of claim 18 wherein the second layer consists essentially of its elemental metal.

26. The method of claim 18 wherein the second layer comprises a non-metal impurity.

27. The method of claim 26 wherein the atomic quantity of "N" in the first layer is greater than the atomic quantity of the non-metal impurity in the second layer.

28. The method of claim 26 wherein the non-metal impurity in the second layer comprises N.

29. The method of claim 26 wherein the non-metal impurity in the second layer is present at less than or equal to 30% atomic.

30. The method of claim 18 wherein the second layer is thicker than the first layer.

31. The method of claim 18 wherein the annealing is conducted in a nitrogen containing ambient which transforms a least an outermost portion of the second layer to predominately comprise a stoichiometric metal nitride.

32. A method of forming a silicide interconnect over a silicon comprising substrate comprising:

forming a first layer comprising $TiN_x$ over a region of the silicon comprising substrate where a silicide interconnection is desired, where "x" is greater than 0 and less than 1;

forming a second layer consisting essentially of elemental titanium over the first layer; and annealing the substrate to cause a reaction between, a) the elemental Ti of the second layer and the Ti of the $TiN_x$ layer, and b) silicon of the substrate region, to form titanium silicide.

33. The method of claim 32 wherein the forming of the first layer comprises:

providing a sputter deposition reactor chamber having an inductive coil positioned therein, a metallic target consisting essentially of elemental Ti position therein, and the substrate positioned therein;

feeding a nitrogen containing source gas and a sputtering gas to the reactor chamber; and operating the reactor to provide a selected target power, inductive coil power and substrate bias during the feeding effective to deposit the $TiN_x$ comprising layer.

34. The method of claim 33 wherein the nitrogen containing source gas comprises $N_2$, and the sputtering gas comprises a noble gas.

35. The method of claim 32 wherein the second layer is thicker than the first layer.

36. The method of claim 32 wherein the annealing is conducted in a nitrogen containing ambient which transforms a least an outermost portion of the second layer to predominately comprise stoichiometric titanium nitride.

37. A method of forming a silicide interconnect over a silicon comprising substrate comprising:

providing a buffering layer to silicon diffusion between a refractory metal comprising layer and a silicon containing region of a substrate;

annealing the substrate under conditions effective to diffuse at least some of at least one of the refractory metal and the silicon through the buffering layer to form a silicide of the refractory metal, the buffering layer reducing silicon consumption during the annealing from the region over that which would otherwise occur under the same annealing conditions were the buffering layer not present.

38. The method of claim 37 wherein the buffering layer is from 30 Angstroms to 300 Angstroms thick.

39. The method of claim 37 wherein the buffering layer is thinner than the refractory metal comprising layer.

40. The method of claim 37 wherein the buffering layer is chosen and the annealing is conducted to achieve no more 300 Angstroms consumption of silicon thickness from the silicon containing region.

41. The method of claim 37 wherein the buffering layer comprises a metal layer having a non-metal impurity therein.

42. The method of claim 37 wherein the buffering layer is not predominately comprised of a stoichiometric compound.

43. The method of claim 37 wherein the buffering layer comprises $MN_x$, where "M" is a refractory metal and "x" is greater than 0 and less than 1.

44. The method of claim 43 wherein M is Ti.

45. The method of claim 37 wherein the buffering layer consists essentially of $MN_x$, where "M" is a refractory metal and "x" is greater than 0 and less than 1.

46. The method of claim 37 wherein the refractory metal comprising layer consists essentially of elemental refractory metal.

* * * * *

UNITED STATES PATENT AND TRADEMARK OFFICE
CERTIFICATE OF CORRECTION

PATENT NO.    : 6,524,951 B2
DATED         : February 25, 2003
INVENTOR(S)   : Yongjun Jeff Hu It is certified that error appears in the above-identified patent and that said Letters Patent is hereby corrected as shown below:

Column 4,
Line 21, replace "from OW (neutral) to 1,000 W, an inductive coil power" with
-- from 0W (neutral) to 1,000 W, an inductive coil power --
Line 50, replace "Referred to FIG. 2, an elemental metal comprising second" with
-- Referring to FIG. 2, an elemental metal comprising second --

Column 8,
Line 23, replace "forms a least an outermost portion of the second layer to" with
-- forms at least an outermost portion of the second layer to --
Line 55, replace "forms a least an outermost portion of the second layer to" with
-- forms at least an outermost portion of the second layer to --

Column 9,
Line 10, replace "300 Angstroms consumption of silicon thickness from the" with
-- than 300 Angstroms consumption of silicon thickness from the --

Signed and Sealed this

First Day of July, 2003

JAMES E. ROGAN
*Director of the United States Patent and Trademark Office*